United States Patent
Van Bommel et al.

(10) Patent No.: US 12,123,555 B2
(45) Date of Patent: Oct. 22, 2024

(54) LED FILAMENT ARRANGEMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 197 days.

(21) Appl. No.: 17/787,376

(22) PCT Filed: Dec. 15, 2020

(86) PCT No.: PCT/EP2020/086304
§ 371 (c)(1),
(2) Date: Jun. 20, 2022

(87) PCT Pub. No.: WO2021/136657
PCT Pub. Date: Jul. 8, 2021

(65) Prior Publication Data
US 2022/0373141 A1  Nov. 24, 2022

(30) Foreign Application Priority Data

Jan. 2, 2020 (EP) .................................. 20150060

(51) Int. Cl.
*F21K 9/232* (2016.01)
*F21S 8/06* (2006.01)
(Continued)

(52) U.S. Cl.
CPC ............... *F21K 9/232* (2016.08); *F21S 8/06* (2013.01); *F21V 3/02* (2013.01); *F21V 19/003* (2013.01);
(Continued)

(58) Field of Classification Search
CPC .... F21K 9/232; F21S 8/06; F21V 3/02; F21V 19/003; F21V 23/003; F21Y 2103/10; F21Y 2115/10
(Continued)

(56) References Cited

U.S. PATENT DOCUMENTS 10,386,020 B2   8/2019  Choi et al.
2017/0321852 A1* 11/2017 Handsaker ................ F21V 5/04
(Continued)

FOREIGN PATENT DOCUMENTS

CA    3013021 A1   8/2019
CN  101625957 A    1/2010
(Continued)

*Primary Examiner* — Elmito Breval
*Assistant Examiner* — Hana S Featherly

(57) ABSTRACT

A LED filament arrangement (100), comprising a plurality of LED filaments (110a, 110b), each LED filament comprising an array of a plurality of light emitting diodes (120), LEDs, arranged on an elongated carrier (70), wherein a first LED filament (110a) elongates along a respective first axis, $A_i$, and a second LED filament (110b) of the plurality of LED filaments elongates along a respective second axis, $B_i$, wherein a respective angle, $\theta_i$, between $A_i$ and $B_i$ fulfils $|\theta_i|>10°$, a frame (200) comprising a plurality of first elements (210) defining a mesh structure of the frame, wherein a first element elongates along a respective first element axis, $C_i$, wherein a respective first angle, $\alpha_i$, between $A_i$ and $C_i$, and wherein a respective second angle, $\beta_i$, between $B_i$ and $C_i$ fulfils $|\alpha_i| \neq |\beta_i|$, and a control unit configured to individually control the operation of the first and second LED filaments.

15 Claims, 6 Drawing Sheets

(51) Int. Cl.
  *F21V 3/02* (2006.01)
  *F21V 19/00* (2006.01)
  *F21V 23/00* (2015.01)
  *F21Y 103/10* (2016.01)
  *F21Y 115/10* (2016.01)
(52) U.S. Cl.
  CPC ......... *F21V 23/003* (2013.01); *F21Y 2103/10* (2016.08); *F21Y 2115/10* (2016.08)
(58) Field of Classification Search
  USPC .................................................. 362/249.02
  See application file for complete search history.

(56) References Cited

U.S. PATENT DOCUMENTS

| | | |
|---|---|---|
| 2018/0092169 A1 | 3/2018 | Van Bommel et al. |
| 2018/0328543 A1 | 11/2018 | Bergmann et al. |
| 2018/0352629 A1 | 12/2018 | Crosbie et al. |

FOREIGN PATENT DOCUMENTS

| | | |
|---|---|---|
| CN | 101675711 A | 3/2010 |
| CN | 103904197 A | 7/2014 |
| CN | 204592972 U | 8/2015 |
| CN | 104949059 A | 9/2015 |
| CN | 108194869 A | 6/2018 |
| JP | 2013186942 A | 9/2013 |
| KR | 101918016 B1 | 1/2019 |
| WO | 2018127391 A1 | 7/2018 |
| WO | 2019015763 A1 | 1/2019 |
| WO | 2019166273 A1 | 9/2019 |

\* cited by examiner

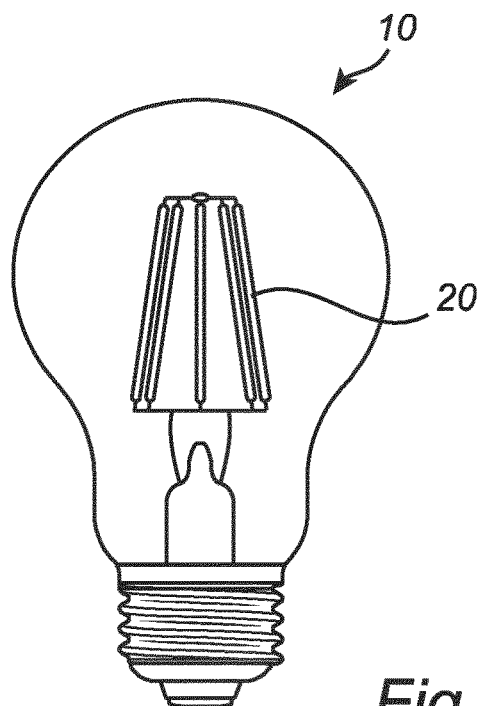
Fig. 1
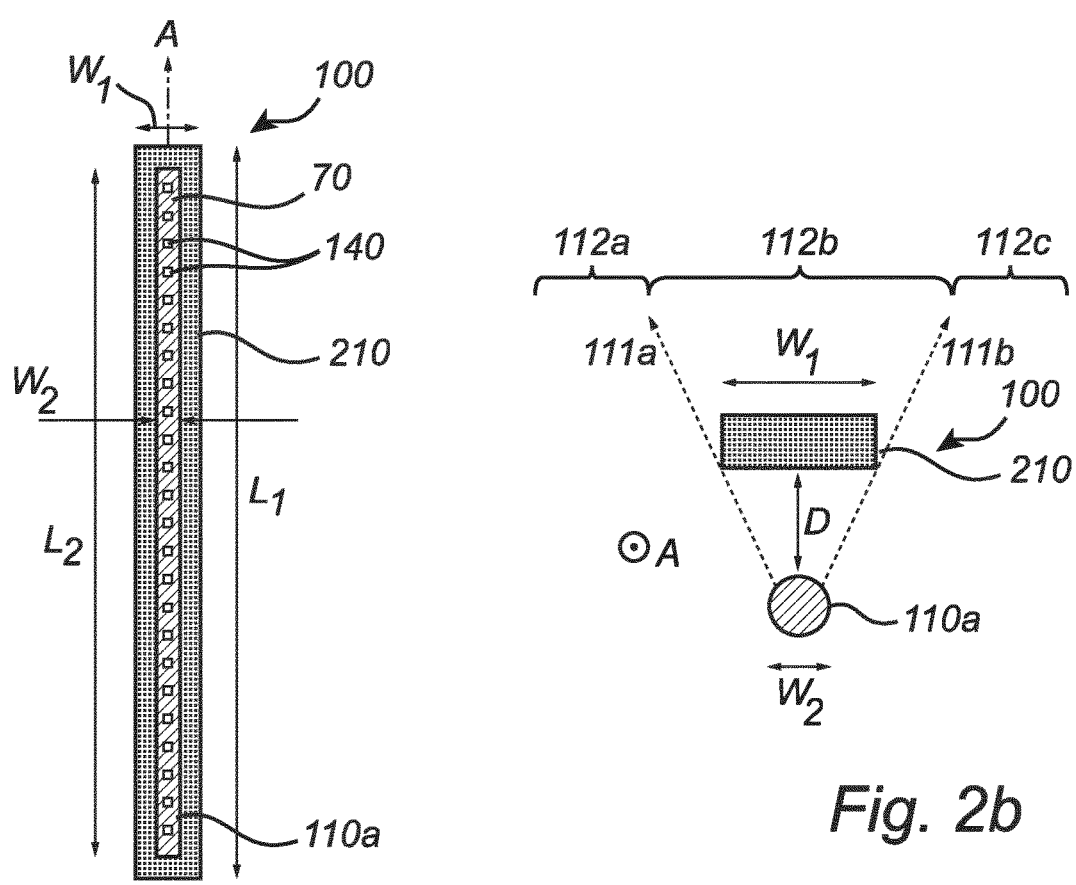
Fig. 2a
Fig. 2b

LED FILAMENT ARRANGEMENT

CROSS-REFERENCE TO PRIOR APPLICATIONS

This application is the U.S. National Phase application under 35 U.S.C. § 371 of International Application No. PCT/EP2020/086304, filed on Dec. 15, 2020, which claim the benefit of European Patent Application No. 20150060.0, filed on Jan. 2, 2020. These applications are hereby incorporated by reference herein.

FIELD OF THE INVENTION

The present invention generally relates to lighting arrangements comprising one or more light emitting diodes (LEDs). More specifically, the present invention is related to a light emitting diode (LED) filament arrangement.

BACKGROUND OF THE INVENTION

The use of light emitting diodes (LEDs) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

There is currently a very large interest in lighting devices and/or arrangements (such as lamps) provided with LEDs, and incandescent lamps are rapidly being replaced by LED-based lighting solutions. It is nevertheless appreciated and desired to have retrofit lighting devices (e.g. lamps) which have the look of an incandescent bulb. For this purpose, it is possible to make use of the infrastructure for producing incandescent lamps based on LED filaments arranged in such a bulb. In particular, LED filament lamps are highly appreciated as they are very decorative.

It is of further interest to have lighting devices and/or arrangements (such as lamps) which are able to produce decorative (white) light and induce improved and/or new dynamic shadows. In the prior art, there are lighting devices which are intended to produce decorative light. However, these lighting devices are often unable to provide a dynamic shadowing in a satisfactory manner.

In CA 3013021 an omnidirectional LED filament holder and lighting device comprising the same comprises a filament tree supporting a plurality of linear LED filaments having a twisted orientation relative to a central support stalk of the filament tree is disclosed. When arranged within a globe of a lighting device, the omnidirectional LED filament holder provides a lighting device providing omnidirectional light emission usable for general lighting applications while providing a desirable aesthetic for the lighting device.

The invention in KR101918016 B1 relates to a visual expression device using shade, capable of making a unique interior atmosphere with shade by emitting light to walls. The visual expression device includes: a light source emitting colorful or unicolor light; a first light block member including a light-penetrative part and a non-light-penetrative light block part; and a second light block member including a light-penetrative part with a light-penetrative color filter surrounding the first light block member and a non-light-penetrative light block part.

Hence, it is an object of the present invention to provide alternatives to existing lamps of the prior art in order to obtain a more decorative lighting while at the same time providing a dynamic shadowing.

SUMMARY OF THE INVENTION

Hence, it is of interest to overcome at least some of the deficiencies of present LED filament lamps, in order to improve the distribution of light during operation.

This and other objects are achieved by providing a LED filament arrangement having the features in the independent claim. Preferred embodiments are defined in the dependent claims.

Hence, according to the present invention, there is provided a light emitting diode, LED, filament arrangement. The LED filament arrangement comprises a plurality of LED filaments. Each LED filament comprises an array of a plurality of light emitting diodes, LEDs, arranged on an elongated carrier. At least one first LED filament of the plurality of LED filaments elongates along a respective first axis, $A_i$, and at least one second LED filament of the plurality of LED filaments elongates along a respective second axis, wherein at least one of a respective angle, $\theta_i$, between $A_i$ and $B_i$, $>10°$. The LED filament arrangement further comprises a frame at least partially enclosing the plurality of LED filaments. The frame comprises a plurality of first elements of elongated shape defining a mesh structure of the frame, wherein the plurality of first elements comprises a material being at least partially opaque. At least one first element of the plurality of first elements elongates along a respective first element axis, $C_i$, wherein a respective first angle, $\alpha_i$, between $A_i$ and $C_i$, and wherein a respective second angle, $\beta_i$, between $B_i$ and $C_i$ fulfils $|\alpha_i| \neq |\beta_i|$. The LED filament arrangement further comprises a control unit configured to individually control the operation of the at least one first LED filament and the at least one second LED filament of the plurality of LED filaments.

Thus, the present invention is based on the idea of providing a LED filament arrangement which, via its LED filaments comprising LEDs, is able to emit light at least partially through its frame during operation of the LED filaments by the control unit. More specifically, the LED filament arrangement is able to modulate a spatial light distribution of the total light emitted by the LED filament arrangement via its frame comprising a plurality of opaque first elements arranged as a mesh. By this specific arrangement of the first LED filament(s), the second LED filament (s), and the plurality of first elements, wherein the first and second LED filaments form the respective angle $|\theta_i|>10°$ between each other, the plurality of LED filaments of the LED filament arrangement may be arranged in many different configurations with respect to each other, while at the same time avoiding the arrangement of being (substantially) parallel, thereby contributing to the dynamic shadowing effect. Furthermore, one or more first LED filaments are arranged at a respective first angle, $\alpha_i$, with respect to the first element(s), whereas one or more second LED filaments are arranged at a respective second angle, $\beta_i$, with respect to the first element(s), which fulfils $|\alpha_i| \neq |\beta_i|$, i.e. such that the first and second LED filaments are arranged at different angles with respect to the first elements, which also contributes to the dynamic shadowing effect. Hence, the LED filament arrangement is hereby able to produce decorative (white) light while at the same time being able to induce a dynamic shadowing effect.

It will be appreciated that the LED filament arrangement of the present invention furthermore comprises relatively few components. The relatively low number of components is advantageous in that the LED filament arrangement is relatively inexpensive to fabricate. Moreover, the relatively low number of components of the LED filament arrangement implies an easier recycling, especially compared to devices or arrangements comprising a relatively high number of components which impede an easy disassembling and/or recycling operation.

There is provided a light emitting diode, LED, filament arrangement. The LED filament arrangement comprises a plurality of LED filaments. A LED filament is providing LED filament light and comprises a plurality of LEDs arranged in a linear array. By the term "array", it is here meant a linear arrangement, row or chain of LEDs, or the like, arranged on the LED filament. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier or a substrate, like for instance a carrier that may be rigid (made from e.g. a polymer, glass, quartz, metal or sapphire) or flexible (e.g. made of a polymer or metal e.g. a film or foil of poly imide). In case the carrier comprises a first major surface and an opposite second major surface, the LEDs are arranged on at least one of these surfaces, e.g. on both of the first and second major surfaces. The carrier may be reflective or light transmissive, such as translucent and preferably transparent. The LED filament may comprise an encapsulant at least partly covering at least part of the plurality of LEDs. The encapsulant may also at least partly cover at least one of the first major or second major surface. By the term "encapsulant", it is here meant a material, element, arrangement, or the like, which is configured or arranged to surround, encapsulate and/or enclose the plurality of LEDs of the LED filament(s).

At least one first LED filament of the plurality of LED filaments elongates along a respective first axis, $A_i$, and at least one second LED filament of the plurality of LED filaments elongates along a respective second axis, $B_i$. At least one of a respective angle, $\theta_i$, between $A_i$ and $B_i$ fulfils $|\theta_i|>10°$. In other words, each pair of LED filaments of the plurality of LED filaments may be arranged at a respective angle, $\theta_{i=1, 2, \ldots, n}$ in space with respect to each other, wherein at least one of the angles fulfils $|\theta_i|>10°$. The LED filament arrangement further comprises a frame at least partially enclosing the plurality of LED filaments. By the term "frame", it is here meant a structure, support, construction, or the like, which may have the shape of a grid or mesh. The frame comprises a plurality of first elements of elongated shape defining a mesh structure of the frame, wherein the plurality of first elements comprises a material being at least partially opaque. Hence, the plurality of first elements may comprise a material which is partially, or totally, opaque or non-transparent. It will be appreciated that the first elements may be construed as "blocking elements" and/or "blocking portions" of the frame. At least one first element of the plurality of first elements elongates along a respective first element axis, $C_i$, wherein a respective first angle, $\alpha_i$, between $A_i$ and $C_i$, and wherein a respective second angle, $\beta_i$, between $B_i$ and $C_i$ fulfils $|\alpha_i| \neq |\beta_i|$. Hence, the first angle(s) $\alpha_i$ between the at least one first LED filament and the at least one first element of the frame, and the second angle(s) $\beta_i$ between the at least one second LED filament and the at least one first element differ from each other in their absolute values. In other words, the first and second LED filaments may be arranged at different angles with respect to one or more first elements of the plurality of first elements.

The LED filament arrangement further comprises a control unit configured to individually control the operation of the at least one first LED filament at the at least one second LED filament of the plurality of LED filaments. By the term "operation", it is hereby meant e.g. an on/off operation, an increasing and/or decreasing of the light intensity, variation of the color of the light emitted from the LEDs of the plurality of LED filaments. For example, the control unit may be configured to control the operation of the first and second LED filaments such that the first LED filament(s) is (are) arranged to emit a first light output and the second LED filament(s) is (are) arranged to emit second light output. The present embodiment is advantageous in that the LED filament arrangement is hereby able to produce decorative (white) light while at the same time being able to induce improved and/or new dynamic shadows.

According to an embodiment of the present invention, the frame may further comprise a plurality of second elements arranged between the first elements, wherein the plurality of second elements comprises a material being at least partially light-transmissive. Preferably, the plurality of second elements is (fully) light transmissive, leading to an even further improved shadowing effect. It will be appreciated that the second elements may be construed as "contrast elements", "contrast producing elements", or the like, of the frame.

According to an embodiment of the present invention, $|\alpha_i|<20°$ and $|\beta_i|>40°$. In other words, the respective first angle, $\alpha_i$, between the at least one first LED filament and the respective first element may be relatively small, whereas the respective second angle, $\beta_i$, between the at least one second LED filament and the respective first element may be relatively large. The present embodiment is advantageous in that the one or more first LED filaments may be arranged parallel or substantially parallel with the first element(s), or may form (a) relatively small angle(s) with the first element(s), whereas the one or more second LED filaments may be arranged at (a) relatively large angle(s) with the first element(s). This particular arrangement of the first and second LED filaments with respect to the at least partially opaque first elements of the frame may induce an even more dynamic and/or aesthetical shadowing effect.

According to an embodiment of the present invention, $|\theta_i|$ may be in the range of 60-90°, preferably in the range of 70-90°, and even more preferred in the range of 80-90°. For example, in case of a first and a second LED filament, the two LED filaments may preferably be arranged at an angle, $\theta_i$ in the range of 80-90° with respect to each other. Hence, the first and second LED filament may in this example be arranged (substantially) perpendicular to each other in space. Furthermore, in combination with a relatively small respective first angle $\alpha_i$ between a first LED filament(s) and a first element, respectively, the first LED filament(s) may be arranged (substantially) parallel to the first element(s) whereas the second LED filament(s) may be arranged (substantially) perpendicular to the first element(s). The present embodiment is advantageous in that this arrangement of the first and second LED filaments with respect to each other may even further enhance the decorative aspect of the light and the dynamic shadowing thereof during operation of the LED filament arrangement.

According to an embodiment of the present invention, at least one third LED filament of the plurality of LED filaments may elongate along a respective third axis, $D_i$, wherein at least one of the respective angles, $\theta_i$, between $A_i$ and $B_i$, between $A_i$ and $D_i$, and between $B_i$ and $D_i$, respectively, may fulfil $|\theta_i|>10°$. Hence, for at least one arbitrary pair of the at least one first, second and third LED filaments, the respective pair of LED filaments may be arranged at an angle, $\theta_j$, with respect to each other, wherein $|\theta_j|>10°$. The present embodiment is advantageous in that this arrangement of the first, second and third LED filaments with respect to each other may result in an even more dynamic shadowing during operation of the LED filament arrangement.

According to an embodiment of the present invention, $|\theta_j|$ may be in the range of 30-60°. Hence, the at least one first LED filament, the at least one second LED filament and the at least one third LED filament may be arranged at an angle, $\theta_j$ in the range of 30-60° with respect to each other. It will be appreciated that the plurality of LED filaments of the LED filament arrangement may be arranged in many different configurations with respect to each other, while at the same time avoiding the arrangement of being (substantially) parallel. For example, the arrangement of the plurality of LED filaments in the LED filament arrangement may be symmetric, which may even further contribute to the aesthetical appearance of the LED filament arrangement and/or the light emitted therefrom during operation. The present embodiment is advantageous in that this wide range of choice of the arrangements of the LED filaments with respect to each other may result in an even more decorative lighting and/or dynamic shadowing during operation.

According to an embodiment of the present invention, the frame may comprise at least 3, preferably at least 5, and even more preferred 10 first elements which are arranged substantially parallel to at least one LED filament of the plurality of LED filaments. Hence, the respective first angle, $\alpha_i$, between the respective first axis $A_i$ of the at least one first LED filament and the respective first element axis, $C_i$, of the plurality of first elements may be 0°, or close to 0°.

According to an embodiment of the present invention, the frame may comprise at least 3, preferably at least 5, and even more preferred 10 first elements which are arranged substantially perpendicular to at least one LED filament of the plurality of LED filaments. Hence, the respective first angle, $\alpha_i$, between the respective first axis $A_i$ of the at least one first LED filament and the respective first element axis, of the plurality of first elements may be 90°, or close to 90°.

According to an embodiment of the present invention, the LED filament arrangement may further comprise an envelope at least partly enclosing the plurality of LED filaments. The frame may be arranged inside the envelope. For example, the frame may be arranged between the plurality of LED filaments and the envelope. Alternatively, the frame may be arranged outside the envelope.

According to an embodiment of the present invention, the relationship between the width, $W_1$, of the plurality of first elements and the width, $W_2$, of the plurality of LED filaments may be $2W_2<W_1<20W_2$, preferably $3W_2<W_1<15W_2$, and even more preferred $4W_2<W_1<10W_2$.

According to an embodiment of the present invention, the relationship between the width, $W_1$, of the plurality of first elements and the length, $L_2$, of the plurality of LED filaments may be $2W_1<L_2$, preferably $2.5W_1<L_2$, and even more preferred $3W_1<L_2$.

According to an embodiment of the present invention, the control unit may be configured to control the operation of the plurality of LED filaments such that the light emitted by a first LED filament is varied with respect to the light emitted by a second LED filament, while the light emitted by the plurality of LED filaments is constant over time. For example, the control unit may be configured to vary the luminous flux of the light emitted from the respective LED filament of the plurality of LED filaments, while at the same time being configured to maintain or keep the total luminous flux of the light emitted from the plurality of LED filaments within a (relatively small) predetermined interval as a function of time. The present embodiment is advantageous in that an even more decorative lighting and dynamic shadowing of the light emitted from the LED filament arrangement may be obtained.

According to an embodiment of the present invention, each LED filament may further comprise an encapsulant comprising a light-transmissive material, wherein the encapsulant at least partially encloses the plurality of LEDs. The encapsulant may even further contribute to an improved decorative lighting effect of the LED filament arrangement.

According to an embodiment of the present invention, the encapsulant may further comprise a luminescent material and is configured to at least partly convert the light emitted by the plurality of LEDs. Hence, via the encapsulant, the light may be converted into converted light. Thus, the light emitted from the plurality of LED filaments may comprise the light emitted by the plurality of LEDs and the converted light by the encapsulant of the plurality of LED filaments.

According to an embodiment of the present invention, the carrier may be transparent.

According to an embodiment of the present invention, there is provided a lamp comprising a LED filament arrangement according to any one of the preceding embodiments. The frame of the LED filament arrangement may constitute a lamp shade, and the lamp may further comprise an electrical connection configured to supply power to the plurality of LEDs of the plurality of LED filaments. The present embodiment is advantageous in that the lamp, via its LED filament arrangement, may produce decorative (white) light and induce improved and/or dynamic shadows. It will be appreciated that the control unit configured to control the operation of at least one LED filament of the plurality of LED filaments may be integrated with the electrical connection of the lamp.

According to an embodiment of the present invention, the LEDs may be equidistantly arranged on the carrier. In other words, the LEDs may be arranged on the carrier in a symmetric manner, wherein each LED is arranged at the same distance from adjacently arranged LEDs.

According to an embodiment of the present invention, the plurality of LEDs may have the same color or color temperature. By the term "color temperature", it is here meant the temperature of an ideal black-body radiator that radiates light of a color comparable to that of the LEDs. In other words, the plurality of LEDs may have the same color point. Preferably, the plurality of LEDs may be white LEDs.

According to an embodiment of the present invention, the control unit may comprise a random current generator configured to supply current which varies randomly, to the plurality of LEDs. By the term "random current generator", it is here meant substantially any generator, unit, or the like, which is configured to generate and supply a current which randomly varies in amplitude with time. The present embodiment is advantageous in that the randomly generated current(s) of the random current generator may contribute to obtaining a resemblance of candle light by the light emitted from the LEDs. Consequently, this effect may even further contribute to the decorative aspect of the LED filament arrangement.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

FIG. 1 schematically shows a LED filament lamp according to the prior art, comprising LED filaments, FIGS. 2*a-d* schematically show side views and top views of portions of a LED filament arrangement according to exemplifying embodiments of the present invention, FIGS. 3*a-c* schematically show side views of portions of a LED filament arrangement according to an embodiment of the present invention, FIGS. 4*a,b* schematically show side views of a LED filament arrangement according to exemplifying embodiments of the present invention, FIG. 5 schematically shows a LED filament arrangement according to an exemplifying embodiment of the present invention, and FIG. 6 schematically shows a lamp comprising a LED filament arrangement according to an exemplifying embodiment of the present invention.

DETAILED DESCRIPTION

Figure 2C:
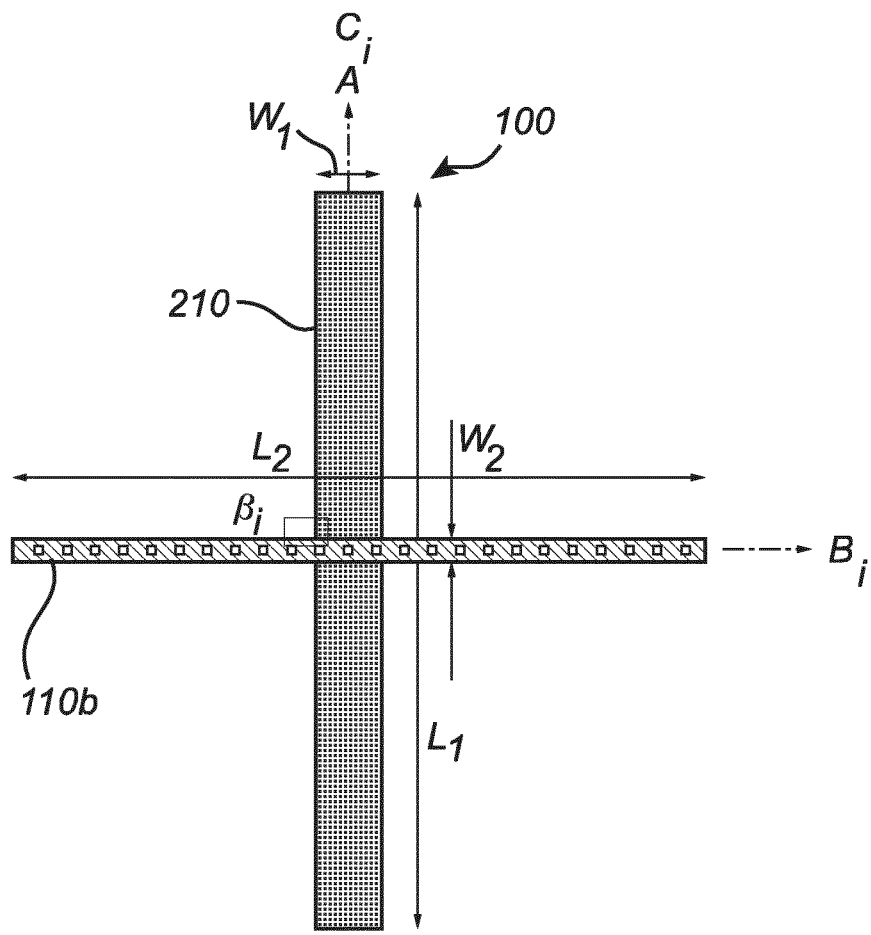

FIG. 1 shows a LED filament lamp 10 according to the prior art, comprising a plurality of LED filaments 20. LED filament lamps 10 of this kind are highly appreciated as they are very decorative, as well as providing numerous advantages compared to incandescent lamps such as a longer operational life, a reduced power consumption, and an increased efficiency related to the ratio between light energy and heat energy. However, these lighting devices are often unable to provide a dynamic shadowing during operation. Hence, it is desirable to provide alternatives to existing lamps of the prior art in order to obtain a decorative lighting while at the same time providing a dynamic shadowing.

FIG. 2*a* schematically shows a side view of a portion of a LED filament arrangement 100 according to an embodiment of the present invention. For reasons of simplicity, only a single (first) LED filament 110*a* and a single first element 210 of the LED filament arrangement 100 are shown. The elongated LED filament 110*a* elongates along a first axis, $A_i$, and the elongated first element 210 elongates along a respective first element axis, $C_i$, wherein these axes, according to this example, are parallel to a main axis, A. Hence, a first angle, $\alpha_i$, between $A_i$ and $C_i$, is 0° in this example.

It should be noted that the LED filament arrangement 100 preferably comprises N LED filaments 110*a*. For example, the LED filament arrangement may preferably comprise 2-10 LED filaments 110*a*, more preferably 3-8 LED filaments 110*a*, and even more preferred 4-6 LED filaments 110*a*. The LED filament 110*a* may preferably have a length $L_2$ in the range from 1 cm to 20 cm, more preferably 2 cm to 12 cm, and most preferred 3 cm to 10 cm. The LED filament 110*a* may preferably have a width $W_2$ in the range from 0.5 mm to 10 mm, more preferably 0.8 mm to 8 mm, and most preferred 1 to 5 mm. The aspect ratio $L_2/W_2$ of the LED filament 110*a* is preferably at least 10, more preferably at least 13, and most preferred at least 15.

The LED filament 110*a* comprises an array or "chain" of LEDs 140 which is arranged on an elongated carrier 70 or substrate of the LED filament arrangement 100. For example, the array or "chain" of LEDs 140 may comprise a plurality of adjacently arranged LEDs 140. The LED filament arrangement 100 preferably comprises N LEDs 140. For example, the plurality of LEDs 140 preferably comprises more than 20 LEDs, more preferably more than 25 LEDs, and even more preferred more than 30 LEDs. The LEDs 140 may be equidistantly arranged on the carrier 70. In other words, the LEDs 140 may be arranged on the carrier 70 in a symmetric manner, wherein each LED is arranged at the same distance from adjacently arranged LEDs.

The plurality of LEDs 140 may be direct emitting LEDs which provide a color. The LEDs 140 are preferably blue LEDs. The LEDs 140 may also be UV LEDs. A combination of LEDs 140, e.g. UV LEDs and blue light LEDs, may be used. The LEDs 140 may comprise laser diodes. The light emitted from the LED filament 120 during operation is preferably white light. The white light is preferably within 15 SDCM from the black body locus (BBL). The color temperature of the white light is preferably in the range of 2000 to 6000 K, more preferably in the range from 2100 to 5000 K, most preferably in the range from 2200 to 4000 K such as for example 2300 K or 2700 K. The white light has preferably a CRI of at least 75, more preferably at least 80, most preferably at least 85 such as for example 90 or 92. The carrier 70 of the LED filament arrangement 100 may be flexible, e.g. a foil. Alternatively, the carrier 70 may be rigid, and e.g. be made of glass, quartz, sapphire and/or a polymer.

In FIG. 2*a*, the LED filament 110*a* further comprises an elongated encapsulant comprising a light-transmissive material, wherein the encapsulant at least partially encloses the plurality of LEDs 140. For example, the encapsulant fully encloses the plurality of LEDs 140, and hence, also at least a portion of the carrier 70. The encapsulant may comprise a luminescent material, which is configured to emit light under external energy excitation. For example, the luminescent material may comprise a fluorescent material. The luminescent material may comprise an inorganic phosphor, and organic phosphor and/or quantum dots/rods. The UV/blue LED light may be partially or fully absorbed by the luminescent material and converted to light of another color e.g. green, yellow, orange and/or red. For example, a UV/blue LED light may be partially or fully absorbed by the luminescent material and converted to light of another color e.g. green, yellow, orange and/or red. Preferably, the encapsulant of the LED filament is used with blue and/or UV LEDs. Furthermore, e.g. in the case of the LED filament 110*a* comprising RGB LEDs, the encapsulant may comprise a light scattering material to scatter the light of the (RGB) LEDs. The light scattering material may comprise light scattering particles such as e.g. $BaSO_4$, $Al_2O_3$ and/or $TiO_2$ particles. It will be appreciated that the light scattering material may also be applied to and/or in other components and/or portions of the LED filament arrangement. The encapsulant may further comprise silicone. The thickness of the encapsulant may preferably be constant along the length of the LED filament 110*a*. Furthermore, the concentration and/or type of luminescent material of the encapsulant may preferably be constant along the LED filament 110*a*.

In FIG. 2*a*, the first element 210 forms part of a frame at least partially enclosing a plurality of LED filaments (of which only a single LED filament 110*a* is shown) of the LED filament arrangement 100. Albeit the frame of the LED filament arrangement 100 comprises a plurality of first elements 210, only a single first element 210 is disclosed for reasons of simplicity. The first element 210 has an elongated shape, such as a rod shape, and comprises a material which is at least partially opaque. Preferably, the first element 210 is (completely) light blocking, wherein its reflective or absorption properties is >99%. The first element 210 may be white or black or metallic. As yet another example, the first element 210 may be hollow, and may comprise air. The relationship between the width, $W_1$, of the first element 210 and the width, $W_2$, of the LED filament 110a is $2W_2<W_1<20W_2$, preferably $3W_2<W_1<15W_2$, and even more preferred $4W_2<W_1<10W_2$. Furthermore, the relationship between the width, $W_1$, of the first element 210 and the length, $L_2$, of the LED filament 110a is $2W_1<L_2$, preferably $2.5W_1<L_2$, and even more preferred $3W_1<L_2$. It will be appreciated that the first elements 210 may have different widths. The transmittance of the plurality of first elements 210 is preferably less than 30%, more preferred less than 10%, and most preferred less than 5%.

FIG. 2b schematically shows a top view of a portion of a LED filament arrangement 100 according to an embodiment of the present invention. It should be noted that FIG. 2b corresponds to FIG. 2a, as FIG. 2b merely shows FIG. 2a from another view as indicated by the axis A. Due to this, it is referred to FIG. 2a for a more detailed understanding of the properties and/or embodiments of the LED filament arrangement 100. As illustrated by FIG. 2b, the width, $W_2$, of the LED filament 110a and the width, $W_1$, of the first element 210, as well as the distance, D, between the LED filament 110a and the first element 210 in a direction perpendicular to the axis A, influence the shadow properties of the light emitted from the lighting device 100 during operation. This is indicated by the schematically illustrated light rays 111a, 111b emitted from the LED filament 110a during operation, resulting in illuminated portions of space 112a, 112c and the portion of space 112b being in shadow behind the first element 210.

FIG. 2c schematically shows a side view of a portion of a LED filament arrangement 100 according to an embodiment of the present invention. For reasons of simplicity, only a single (second) LED filament 110b and a single first element 210 are shown. The second LED filament 110b elongates along a second axis, and the elongated first element 210 elongates along the first element axis, $C_i$, which is parallel to the axis A. Hence, a second angle, $\beta_i$, between $B_i$ and $C_i$, is 90° in this example. It should be noted that the properties of the LED filament 110b of FIG. 2c corresponds to the LED filament 110a of FIG. 2a, and it is therefore referred to FIG. 2a for a more detailed understanding. For example, also the LED filament 110b comprises an array or "chain" of LEDs 140 which is arranged on an elongated carrier of the LED filament arrangement 100. Furthermore, the length $L_1$ and width $W_1$ of the first element 210 and the length $L_2$ and width $W_2$ of the LED filament 110b are the same as for the first element 210 and the LED filament 110a in FIG. 2a. In FIG. 2c, however, the LED filament 110b is arranged perpendicular to the LED filament 110a in FIG. 2a. This will influence the properties of the shadowing during operation of the LED filament arrangement 100, which is further described in FIG. 2d.

Figure 2D:
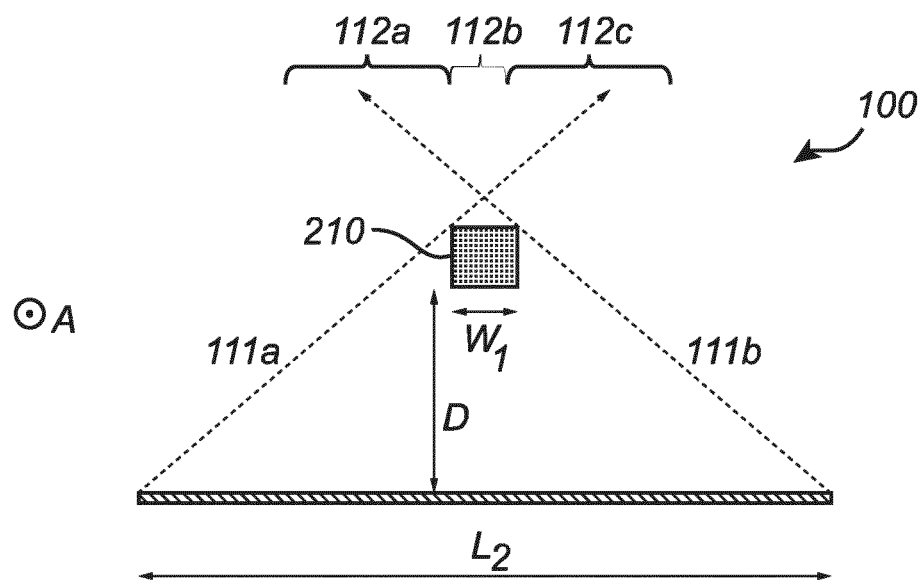

FIG. 2d schematically shows a top view of a portion of a LED filament arrangement 100 according to an embodiment of the present invention. It should be noted that FIG. 2d corresponds to FIG. 2c, as FIG. 2d merely shows FIG. 2c from another view as indicated by the axis A. Due to this, it is referred to FIG. 2c (and also FIG. 2a) for a more detailed understanding of the properties and/or embodiments of the LED filament arrangement 100. As illustrated by FIG. 2d, the length, $L_2$, of the LED filament 110b and the width, $W_1$, of the first element 210 as well as the distance, D, between the LED filament 110a and the first element 210 in a direction perpendicular to the axis A, influence the shadow properties of the light emitted from the lighting device 100 during operation. This is indicated by the schematically illustrated light rays 111a, 111b emitted from the LED filament 110a during operation, resulting in illuminated portions of space 112a, 112c and the portion of space 112b being in shadow immediately behind the first element 210.

Figure 3A:
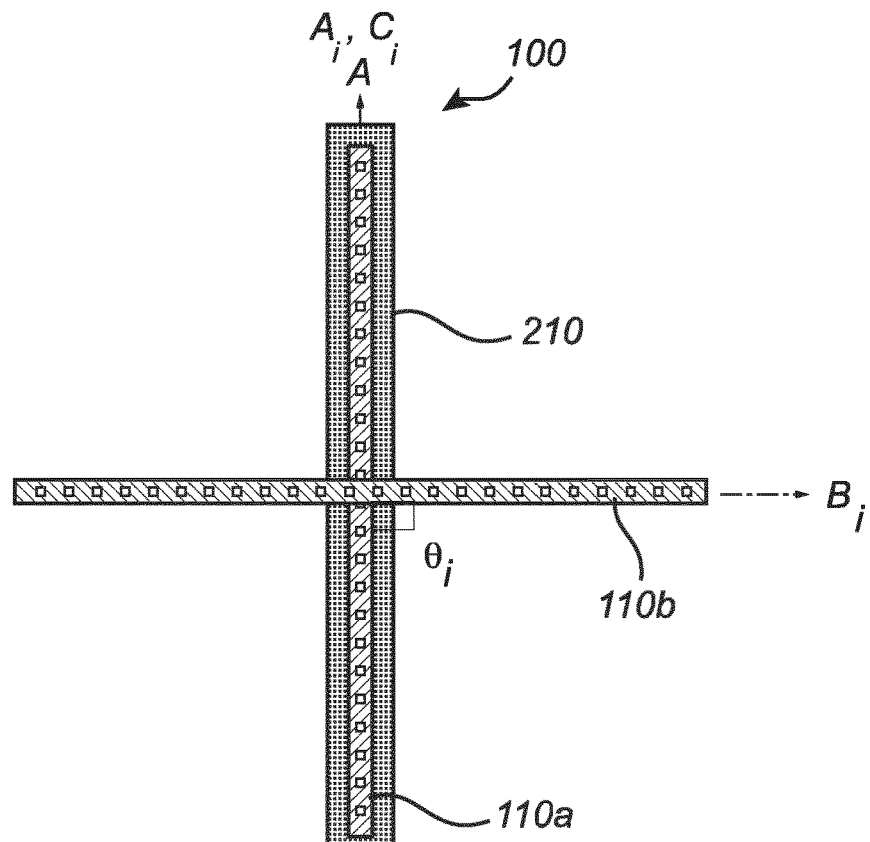

FIG. 3a schematically shows a side view of a portion of a LED filament arrangement 100 according to an embodiment of the present invention. FIG. 3a corresponds to FIGS. 2a and 2c, albeit FIG. 3a comprises a first LED filament 110a and a second LED filament 110b. The first and second LED filaments 110a, 110b are arranged perpendicular to each other, i.e. the first LED filament 110a elongates along the first axis, $A_i$, and the second LED filament 110b elongates along the second axis, $B_i$, wherein the angle, $\theta_i$, between $A_i$ and $B_i$ is 90°, i.e. $|\theta_i|>10°$. It will be appreciated that the first and second LED filaments 110a, 110b may alternatively be arranged at an angle $\theta_i$ in the range of 60-90°, preferably in the range of 70-90°, and even more preferred in the range of 80-90° with respect to each other. Furthermore, the first element 210 elongates along the first element axis, $C_i$, which, according to this example, is parallel to $A_i$ and parallel to the main axis, A. Hence, a first angle, $\alpha_i$, between $A_i$ and $C_i$, is 0° in this example.

Figure 3B:
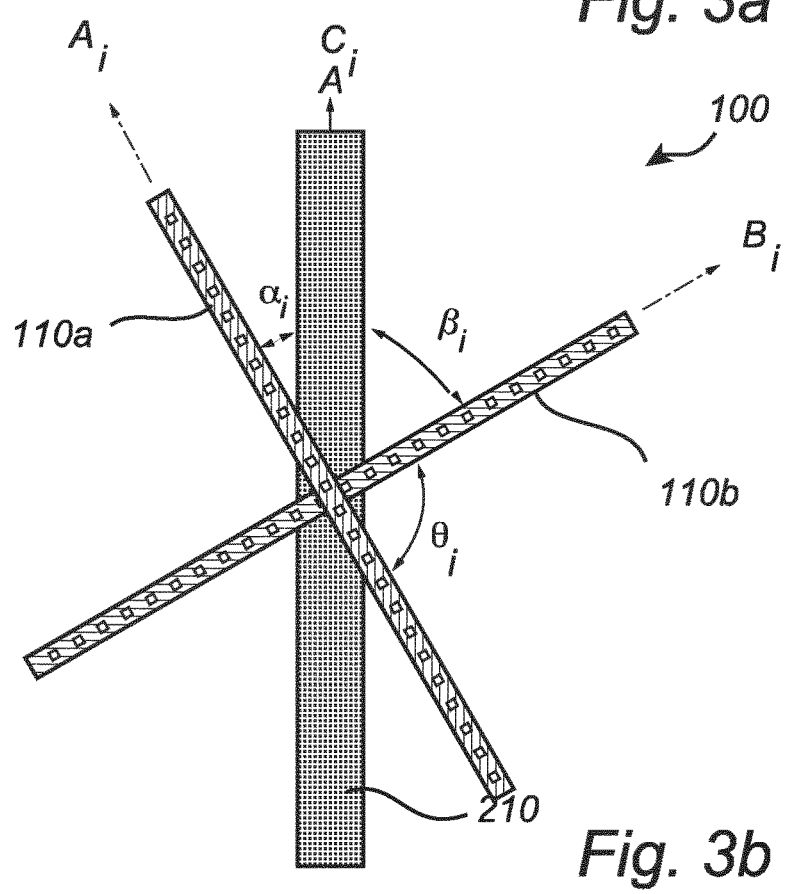

FIG. 3b schematically shows a side view of a portion of a LED filament arrangement 100 according to an embodiment of the present invention. A first LED filament 110a which elongates along a first axis, $A_i$, is arranged at a first angle, $\alpha_i$, with respect to a first element 210 which elongates along a first element axis, $C_i$. Furthermore, a second LED filament 110b which elongates along a second axis, is arranged at a second angle, $\beta_i$, with respect to the first element 210 and the associated first element axis, $C_i$. In this example, $\alpha=-20°$ and $\beta=70°$ with respect to the axis, $C_i$, along which the first element 210 is arranged, i.e. $|\alpha_i|\neq|\beta_i|$. Furthermore, the first and second LED filaments 110a, 110b are arranged at an angle $\theta_i=90°$ with respect to each other, i.e. $|\theta_i|>10°$.

Figure 3C:
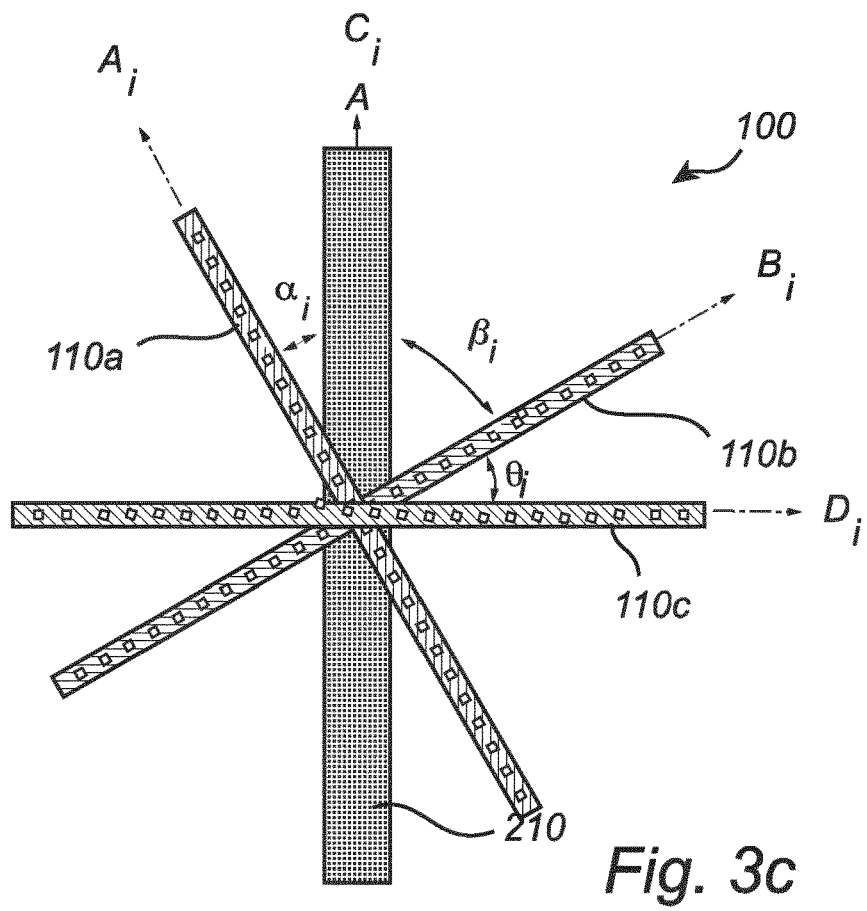

FIG. 3c schematically shows a side view of a portion of a LED filament arrangement 100 according to an embodiment of the present invention. FIG. 3b corresponds to FIG. 3a, albeit FIG. 3c comprises three LED filaments, namely a first LED filament 110a, a second LED filament 110b, and a third LED filament 110c. The first LED filament 110a elongates along a first axis, $A_i$, the second LED filament 110b elongates along a second axis, $B_i$, and the third LED filament 110c elongates along a third axis, $D_i$. The LED filaments 110a, 110b, 110c are arranged at different angles, $\theta_i$, with respect to each other, wherein at least one of the respective angles, $\theta_i$, between $A_i$ and $B_i$, between $A_i$ and $D_i$, and between $B_i$ and $D_i$, respectively, fulfils $|\theta_i|>10°$. Furthermore, The LED filaments 110a, 110b, 110c are arranged at different angles with respect to the first element 210. For example, a first angle, $\alpha_i$, between the first axis $A_i$ of the first LED filament 110a and the first element axis $C_i$, and a second angle, $\beta_i$, between $B_i$ and $C_i$ fulfils $|\alpha_i|\neq|\beta_i|$. Furthermore, the first angle, $\alpha_i$, between the first axis $A_i$ of the first LED filament 110a and the first element axis $C_i$ is relatively small, e.g. $|\alpha_i|<20°$, and the second angle, $\beta_i$, between the second axis $B_i$ of the second LED filament 110b and the first element axis $C_i$ is relatively large, e.g. $|\beta_i|>40°$. It will be appreciated that these configurations of the LED filament arrangement 100 merely represent examples, and that substantially any other configuration of the LED filaments 110a, 110b, 110c and/or first element(s) 210 may be possible. For example, each pair of the first, second and third LED filaments 110a, 110b, 110c may be arranged at a respective angle, θ_i, in the range of ±30-60° with respect to each other.

Figure 4A:
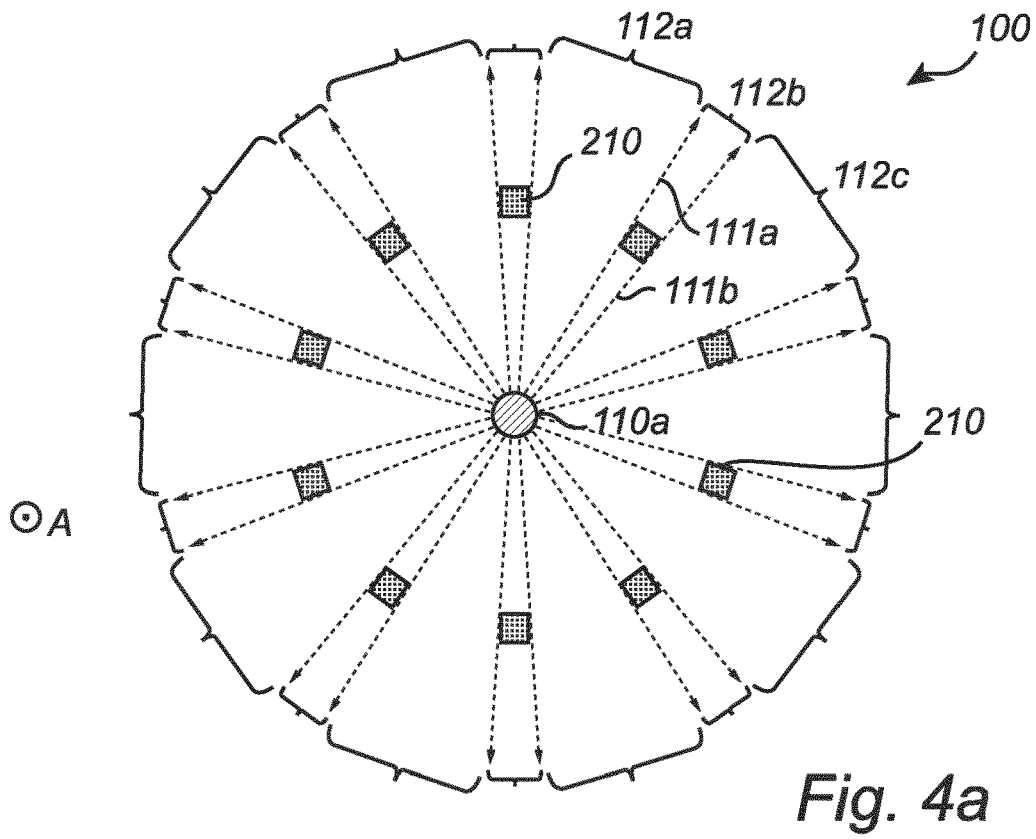

FIG. 4a schematically shows a top view of a portion of a LED filament arrangement 100 according to an embodiment of the present invention. It should be noted that FIG. 4a corresponds to FIG. 2b, and it referred to FIG. 2b for an increased understanding. In FIG. 4a, there is provided a first LED filament 110a and ten first elements 210 of the frame of the LED filament arrangement 100. The first elements 210 are arranged parallel to the first LED filament 110a, i.e. the first elements 210 and the first LED filament 110a are arranged parallel to the axis A. It will be appreciated that the number of first elements 210 with respect to the first element 110a is arbitrary. For example, the frame may comprise at least three, preferably at least five, and even more preferred ten first elements 210 for each LED filament of the LED filament arrangement 100. Furthermore, in FIG. 4a, the first elements 210 are exemplified as being arranged symmetrically around the first LED filament 110a, but it should be noted that the first elements 210 alternatively may be arranged asymmetrically with respect to the first LED filament 110a. The schematically illustrated light rays 111a, 111b emitted from the LED filament 110a during operation respectively results in illuminated portions of space 112a, 112c, wherein the portion of space 112b is in shadow behind the first element 210.

Figure 4B:
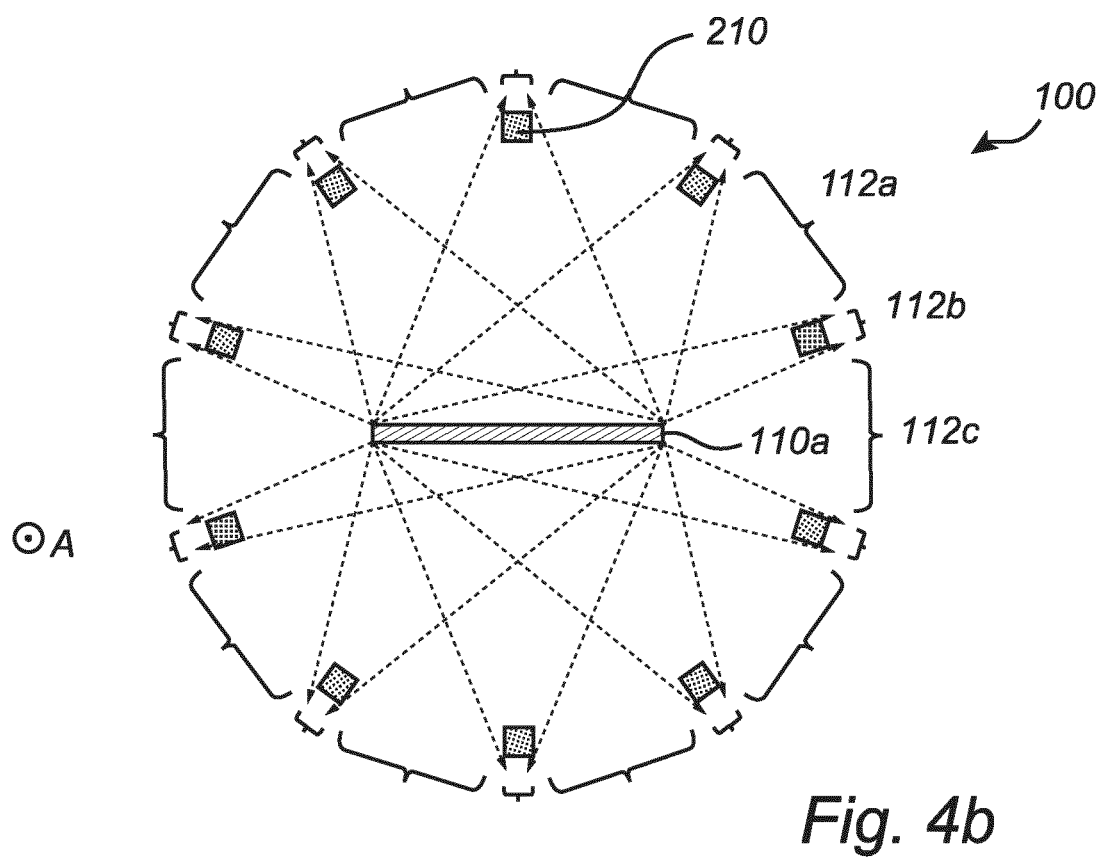

FIG. 4b schematically shows a top view of a portion of a LED filament arrangement 100 according to an embodiment of the present invention. It should be noted that FIG. 4b corresponds to FIG. 2d, and it referred to FIG. 2d for an increased understanding. In FIG. 4b, there is provided a first LED filament 110a and ten first elements 210 of the frame. The first elements 210 are arranged perpendicular to the first LED filament 110a, i.e. the first elements 210 are arranged parallel to the axis A, and the first LED filament 110a is arranged perpendicular to the axis A. It will be appreciated that the number of first elements 210 with respect to the first element 110a is arbitrary. For example, the frame may comprise at least three, preferably at least five, and even more preferred ten first elements 210 for each LED filament of the LED filament arrangement 100. The schematically illustrated light rays 111a, 111b emitted from the LED filament 110a during operation respectively results in illuminated portions of space 112a,c, wherein the portion of space 112b is in shadow behind the first element 210.

Figure 5:
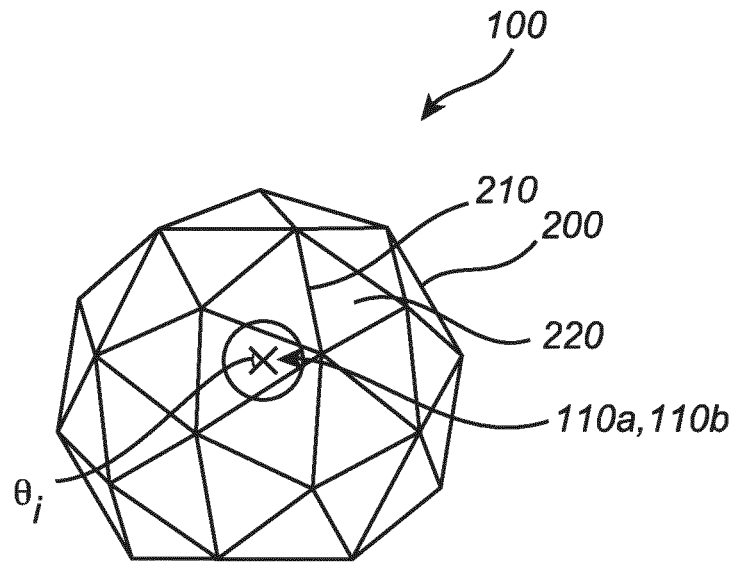

FIG. 5 schematically shows a LED filament arrangement 100 according to an embodiment of the present invention. The LED filament 100 as exemplified comprises two LED filaments 110a, 110b, but it should be noted that the LED filament arrangement 100 may comprise substantially any number of LED filaments. In accordance with the previously described embodiments, each LED filament 110a, 110b comprises an array of a plurality of LEDs arranged on an elongated carrier (not shown). The two LED filaments 110a, 110b are arranged at an angle |θ_i|>10° with respect to each other. The LED filament arrangement 100 comprises a frame 200 which at least partially encloses the LED filaments 110a, 110b. The frame 200 comprises a plurality of first elements 210 of elongated shape and of a material being at least partially opaque. The plurality of first elements 210 defines a mesh structure of the frame 200. According to an example, all first elements of the plurality of first elements 210 may have the same shape and size (dimension). Furthermore, the plurality of first elements 210 may be symmetrically arranged around the LED filaments 110a, 110b of the LED filament arrangement 100.

A plurality of second elements 220 of the LED filament arrangement 100 is arranged between the plurality of first elements 210. Here, the second elements 220 are exemplified as being plate-shaped, but it should be noted that the second elements 220 may have substantially any shape. The second elements 220 comprise a material being at least partially light-transmissive, such that the second elements 220 constitute optically transmissive portions of the frame 200. According to the example in FIG. 5, the frame 200 constituted by the arrangement of the plurality of first and second elements 210, 220 has a faceted structure or configuration. The distance between the two LED filaments 110a, 110b and the frame 200 is preferably in the range from 1 cm to 100 cm, more preferably 3 cm to 60 cm, and even more preferred 10 to 50 cm.

The LED filament arrangement 100 further comprises a control unit (not shown) configured to control the operation of at least one LED filament of the LED filaments 110a, 110b. For example, the control unit may be configured to individually control the operation of the LED filaments 110a, 110b. For example, the control unit may be configured to control the operation of the LED filaments 110a, 110b such that the light emitted by the first LED filament 110a is varied with respect to the light emitted by the second LED filament 110b, while the (total) light emitted by the LED filaments 110a, 110b is constant over time.

Figure 6:
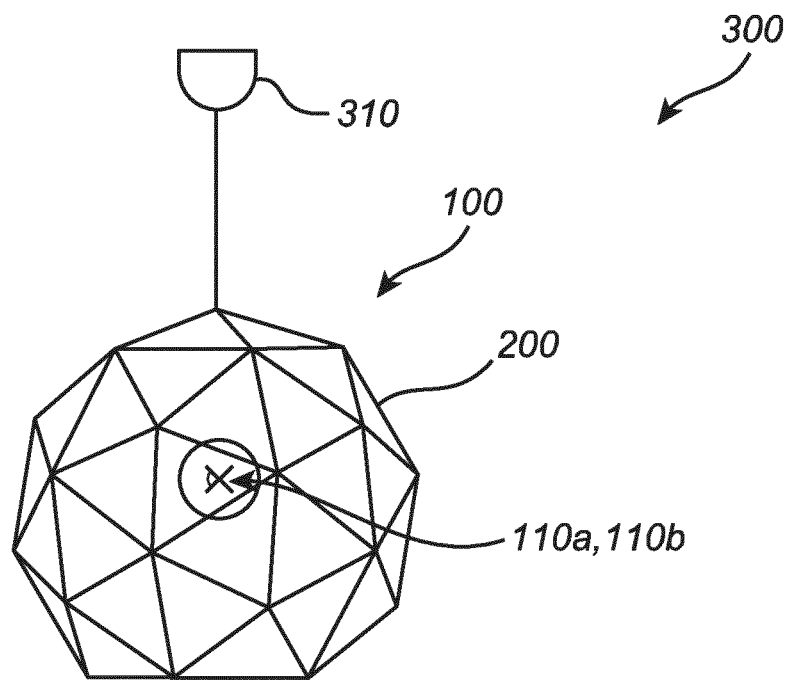

FIG. 6 schematically shows a lamp 300. The lamp 300, or luminaire, comprises a LED filament arrangement 100 according to any previously exemplified embodiment of the present invention. The frame 200 of the lamp 300 constitutes a lamp shade, which is exemplified as a substantially spherical shape albeit its surface is faceted. The frame 200 (lamp shade) at least partially encloses the LED filaments 110a, 110b which are provided at a central portion within the lamp shade. The LED filaments 110a, 110b may be arranged under the same angle (e.g. 0 degrees) with respect to the longitudinal axis of the lamp 300. The lamp 300 further comprises an electrical connection 310 connected to the LED filament arrangement 100 for a supply of power to the plurality of LEDs of the LED filaments 110a, 110b.

The person skilled in the art realizes that the present invention by no means is limited to the preferred embodiments described above. On the contrary, many modifications and variations are possible within the scope of the appended claims. For example, one or more of the LED filament arrangement(s) 100, the LED filament(s) 110a, 110b, the LEDs 140, the plurality of first and/or second elements 210, 220, etc., may have different shapes, dimensions and/or sizes than those depicted/described.

The invention claimed is:

1. A light emitting diode, LED, filament arrangement, comprising a plurality of LED filaments, each LED filament comprising an array of a plurality of light emitting diodes, LEDs, arranged on an elongated carrier, wherein at least one first LED filament of the plurality of LED filaments elongates along a respective first axis, $A_i$, and at least one second LED filament of the plurality of LED filaments elongates along a respective second axis, $B_i$, wherein at least one of a respective angle, $\theta_i$, between $A_i$ and $B_i$ fulfils $|\theta_i|>10°$, a frame at least partially enclosing the plurality of LED filaments, the frame comprising a plurality of first elements of elongated shape defining a mesh structure of the frame, wherein the plurality of first elements comprises a material being at least partially opaque, wherein at least one first element of the plurality of first elements elongates along a respective first element axis, $C_i$, wherein a respective first angle, $\alpha_i$, between $A_i$ and $C_i$, and wherein a respective second angle, $\beta_i$, between $B_i$ and $C_i$ fulfils $|\alpha_i| \neq |\beta_i|$, and a control unit configured to individually control the operation of the at least one first LED filament and the at least one second LED filament of the plurality of LED filaments, such that the at least one first LED filament is arranged to emit a first light output and the at least one second LED filament is arranged to emit second light output, said control unit to control at least one of an on/off-operation, a changing of the light intensity, a variation of the color of the light emitted from the LEDs of the plurality of LED filaments, enabling the LED filament arrangement to produce decorative (white) light or dynamic shadows.

2. The LED filament arrangement according to claim 1, wherein the frame further comprises a plurality of second elements arranged between the plurality of first elements, wherein the plurality of second elements comprises a material being at least partially light-transmissive.

3. The LED filament arrangement according to claim 1, wherein $|\alpha_i| < 20°$ and $|\beta_i| > 40°$.

4. The LED filament arrangement according to claim 1, wherein $\theta_i$ is in the range of 60-90°, preferably in the range of 70-90°, and even more preferred in the range of 80-90°.

5. The LED filament arrangement according to claim 1, wherein at least one third LED filament of the plurality of LED filaments elongates along a respective third axis, $D_i$, wherein at least one of the respective angles, $\theta_i$, between $A_i$ and $B_i$, between $A_i$ and $D_i$, and between $B_i$ and $D_i$, respectively, fulfils $|\theta_i| > 10°$ and preferably wherein $|\theta_i|$ is in the range of 30-60°.

6. The LED filament arrangement according to claim 1, wherein said control unit further comprising a random current generator configured to supply current which varies randomly in amplitude with time to the plurality of LEDs.

7. The LED filament arrangement according to claim 1, wherein the frame comprises at least 3, preferably at least 5, and even more preferred 10 first elements which are arranged substantially parallel to a first LED filament of the plurality of LED filaments.

8. The LED filament arrangement according to claim 1, wherein the frame comprises at least 3, preferably at least 5, and even more preferred 10 first elements which are arranged substantially perpendicular to a first LED filament of the plurality of LED filaments.

9. The LED filament arrangement according to claim 1, wherein the relationship between the width, $W_1$, of the first elements and the width, $W_2$, of the plurality of LED filaments is $2W_2 < W_1 < 20W_2$, preferably $3W_2 < W_1 < 15W_2$, and even more preferred $4W_2 < W_1 < 10W_2$.

10. The LED filament arrangement according to claim 1, wherein the relationship between the width, $W_1$, of the first elements and the length, $L_2$, of the plurality of LED filaments is $2W_1 < L_2$, preferably $2.5W_1 < L_2$, and even more preferred $3W_1 < L_2$.

11. The LED filament arrangement according to claim 1, wherein the control unit is configured to control the operation of the plurality of LED filaments such that the light emitted by the at least one first LED filament is varied with respect to the light emitted by the at least one second LED filament, while the light emitted by the plurality of LED filaments is constant over time.

12. The LED filament arrangement according to claim 1, wherein each LED filament further comprises an encapsulant comprising a light-transmissive material, wherein the encapsulant at least partially encloses the plurality of LEDs.

13. The LED filament arrangement according to claim 12, wherein the encapsulant further comprises a luminescent material and is configured to at least partly convert the light emitted by the plurality of LEDs.

14. The LED filament arrangement according to claim 1, wherein the carrier is transparent.

15. A lamp(300), comprising:
   a LED filament arrangement according to claim 1, wherein the frame constitutes a lamp shade, and
   an electrical connection configured to supply power to the plurality of LEDs of the plurality of LED filaments.

\* \* \* \* \*